(12) United States Patent
Ma et al.

(10) Patent No.: US 11,346,986 B2
(45) Date of Patent: May 31, 2022

(54) METHOD OF MANUFACTURING COLOR FILTER AND COLOR FILTER

(71) Applicant: TCL China Star Optoelectronics Technology Co., Ltd., Shenzhen (CN)

(72) Inventors: Yuanyang Ma, Shenzhen (CN); Miao Zhou, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 413 days.

(21) Appl. No.: 16/623,783

(22) PCT Filed: Nov. 12, 2019

(86) PCT No.: PCT/CN2019/117579
§ 371 (c)(1),
(2) Date: Dec. 18, 2019

(87) PCT Pub. No.: WO2021/022708
PCT Pub. Date: Feb. 11, 2021

(65) Prior Publication Data
US 2021/0199861 A1    Jul. 1, 2021

(30) Foreign Application Priority Data
Aug. 6, 2019   (CN) .......................... 201910723262.3

(51) Int. Cl.
*G02B 5/20* (2006.01)
*G03F 7/00* (2006.01)

(52) U.S. Cl.
CPC ........... *G02B 5/201* (2013.01); *G03F 7/0007* (2013.01); *G03F 7/0035* (2013.01)

(58) Field of Classification Search
CPC .............................. G03F 7/0007; G03F 7/0035
See application file for complete search history.

(56) References Cited

U.S. PATENT DOCUMENTS

| 5,391,442 A | * | 2/1995 | Tsushima | .............. | G03F 7/0007 |
| | | | | | 430/7 |
| 6,866,972 B2 | * | 3/2005 | Ishino | ................... | G03F 7/0035 |
| | | | | | 430/7 |
| 2016/0131937 A1 | * | 5/2016 | Yang | ..................... | G02F 1/1368 |
| | | | | | 430/7 |

FOREIGN PATENT DOCUMENTS

| CN | 1306293 | 8/2001 |
| CN | 1527073 | 9/2004 |
| CN | 101743782 | 6/2010 |

(Continued)

*Primary Examiner* — Stewart A Fraser

(57) ABSTRACT

A method of manufacturing a color filter and a color filter are provided. The method includes steps of manufacturing a color resist layer and an inorganic barrier layer on a base substrate. The step of manufacturing the color resist layer includes sequentially forming a first color resist, a second color resist, and a third color resist, and the first color resist, the second color resist, and the third color resist are repeatedly arranged in order in a direction along a surface of the base substrate. The step of manufacturing the inorganic barrier layer includes forming a first inorganic barrier layer covering the first color resist after the first coloder resist is formed and before the second color resist is formed. By setting the inorganic barrier layer to separate different color resists, it is possible to avoid diffusion pollution between different color resists and ensure a display performance.

13 Claims, 4 Drawing Sheets

(56) References Cited

FOREIGN PATENT DOCUMENTS

| | | |
|---|---|---|
| CN | 105093657 | 11/2015 |
| KR | 10-2018-0092326 | 8/2018 |

\* cited by examiner

```
┌─────────────────────────────────────────────────────────────┐
│ Providing a base substrate on which a first color resist is formed │
│ by a first patterning process                               │
└─────────────────────────────────────────────────────────────┘
                              │
                              ▼
┌─────────────────────────────────────────────────────────────┐
│ Forming a first inorganic barrier layer covering the first color resist │
│ and the base substrate                                      │
└─────────────────────────────────────────────────────────────┘
                              │
                              ▼
┌─────────────────────────────────────────────────────────────┐
│ Forming a second color resist on the first inorganic barrier layer │
│ by a second patterning process                              │
└─────────────────────────────────────────────────────────────┘
                              │
                              ▼
┌─────────────────────────────────────────────────────────────┐
│ Forming a third color resist on the first inorganic barrier layer by a │
│ third patterning process                                    │
└─────────────────────────────────────────────────────────────┘
```

FIG. 1

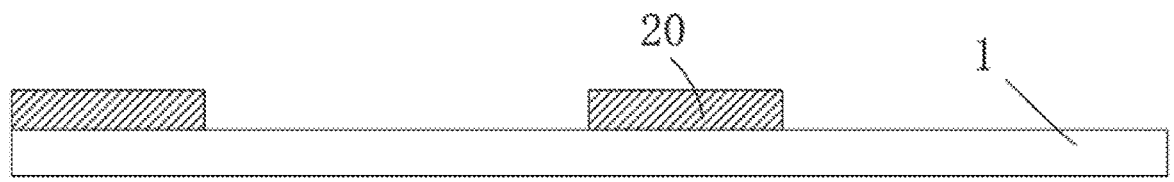

FIG. 2

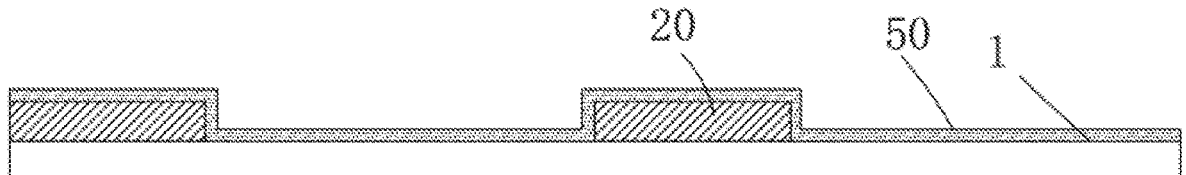

FIG. 3

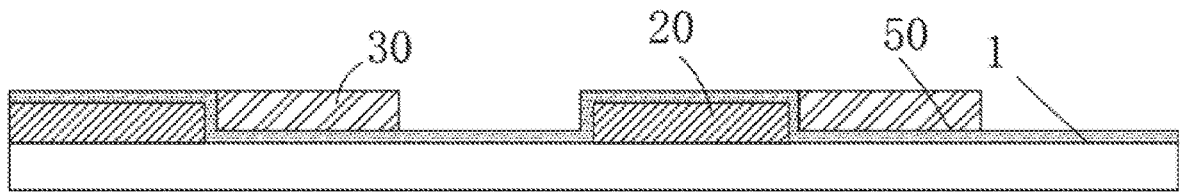

FIG. 4

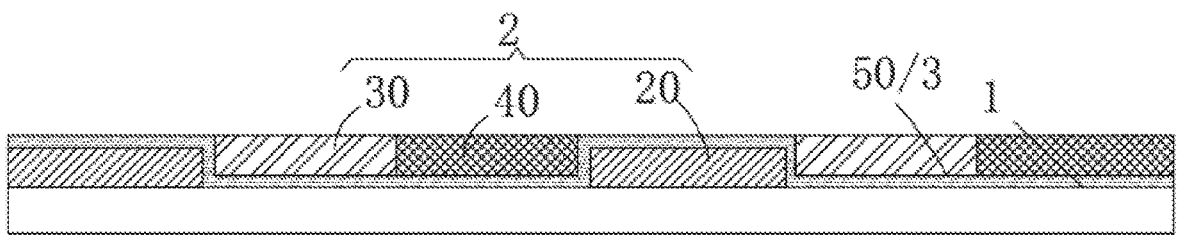

FIG. 5

| Providing a base substrate on which a first color resist is formed by a first patterning process |
|---|
| Forming a first inorganic barrier layer covering the first color resist and the base substrate |
| Forming a second color resist on the first inorganic barrier layer by a second patterning process |
| Forming a second inorganic barrier layer covering the second color resist and the first inorganic barrier layer |
| Forming a third color resist on the first inorganic barrier layer by a third patterning process |

FIG. 6

METHOD OF MANUFACTURING COLOR FILTER AND COLOR FILTER

RELATED APPLICATIONS

This application is a National Phase of PCT Patent Application No. PCT/CN2019/117579 having International filing date of Nov. 12, 2019, which claims the benefit of priority of Chinese Patent Application No. 201910723262.3 filed on Aug. 6, 2019. The contents of the above applications are all incorporated by reference as if fully set forth herein in their entirety.

FIELD AND BACKGROUND OF THE INVENTION

The present disclosure relates to the field of display technologies, and more particularly to a method of manufacturing a color filter and a color filter.

With the development of display technologies, liquid crystal displays (LCDs) and organic light emitting diode displays (OLEDs) and other flat display devices have advantages such as high picture quality, power saving, thin body, and wide applications, etc., are widely used in mobile phones, televisions, personal digital assistants, digital cameras, notebook computers, desktop computers, and other consumer electronic products, and have become a mainstream in display devices.

Color filters (CFs) are important components for providing color in liquid crystal displays and white OLED display devices. The color layers of common color filters mainly include red, green, and blue portions. Display target color is achieved by a combination of light emitting regions of red, green, and blue pixels of different brightness. Such patterned red, green, and blue pixels are typically manufactured using color resists. A common process for manufacturing the same is to apply a color resist on a transparent substrate. After pre-baking, a UV lamp is used in combination with a patterned photomask to expose the color resist to form a color film layer. A pattern is formed after the development process, and finally a color resist film layer is further cured by post-baking.

Generally, material for the above-mentioned color resist mainly include pigment, monomer, alkali-soluble resin, polymer, initiator, additive, solvent, and the like. A main reaction principle for forming a patterned film layer is that, in a stage of exposure to ultraviolet light, the initiator is activated, which triggers a cross-linking polymerization reaction of the monomer to cure a color resist. In a development stage, an alkaline developer can dissolve an uncured color resist to form a pattern. Finally, in a post-baking stage, a resin is further thermally cured, making the entire film layer more resistant.

A main component that provides color in a color resist is pigment.

Pigments are mainly aggregating of pigment molecules with unique chemical structures, which are insoluble in themselves, and are generally dispersed in small organic solvents in a form of small particles. Color filters based on pigments have generally low transmittance, which means that backlights require strong brightness, which inevitably increases energy consumption of display devices. In addition, small pigment particles will inevitably cause a small portion of light scattering, resulting in an increase in dark state transmittance of the display device and a decrease in contrast. At present, a solution in the industry is to mix a part of the dye into the pigment to make a hybrid color resist.

Dyes are soluble pigment molecules. By incorporating a part of the dye, light scattering can be reduced to improve the transmittance and contrast of the color filter. Because dyes are small molecules, some issues are prone to occur in processes of manufacturing color filters. The most common issue is "floating color" caused by a precipitation of dyes, that is, due to a thermal process in a color filter manufacturing process, molecular thermal diffusion diffuses and contaminates adjacent film layers or pixels.

SUMMARY OF THE INVENTION

An object of the present invention is to provide a method of manufacturing a color filter, which can avoid diffusion pollution between color resists of different colors and ensure a display performance.

An object of the present invention is further to provide a color filter, which can avoid diffusion pollution between color resists of different colors and ensure a display performance.

To achieve the above object, an embodiment of the present invention provides a method of manufacturing a color filter, comprising: steps of manufacturing a color resist layer and an inorganic barrier layer on a base substrate. The step of manufacturing the color resist layer comprises a step of sequentially forming a first color resist, a second color resist, and a third color resist, and the first color resist, the second color resist, and the third color resist are repeatedly arranged in order in a direction along a surface of the base substrate. The step of manufacturing the inorganic barrier layer comprises a step of forming a first inorganic barrier layer covering the first color resist after the first color resist is formed and before the second color resist is formed.

In an embodiment of the present invention, the method of manufacturing the color filter comprises following steps: providing the base substrate on which the first color resist is formed by a first patterning process; forming the first inorganic barrier layer covering the first color resist and the base substrate; forming the second color resist on the first inorganic barrier layer by a second patterning process; and forming the third color resist on the first inorganic barrier layer by a third patterning process.

In an embodiment of the present invention, the step of manufacturing the inorganic barrier layer further comprises: a step of forming a second inorganic barrier layer covering the second color resist after the second color resist is formed and before the third color resist is formed.

In an embodiment of the present invention, the method of manufacturing the color filter comprises following steps: providing the base substrate on which the first color resist is formed by a first patterning process; forming the first inorganic barrier layer covering the first color resist and the base substrate; forming the second color resist on the first inorganic barrier layer by a second patterning process; forming the second inorganic barrier layer covering the second color resist and the first inorganic barrier layer; and forming the third color resist on the first inorganic barrier layer by a third patterning process.

In an embodiment of the present invention, material of the color resist layer comprises a mixed color resist material comprising a pigment and a dye, and material of the inorganic barrier layer comprises silicon nitride; the first color resist is one of a red color resist, a green color resist, and a blue color resist; the second color resist is one of the red color resist, the green color resist, and the blue color resist, which is different from the first color resist; and the third color resist is one of the red color resist, the green color resist, and the blue color resist, which is different from the first color resist and the second color resist.

An embodiment of the present invention further provides a color filter, comprising: a base substrate, a color resist layer, and an inorganic barrier layer. The color resist layer comprises a first color resist, a second color resist, and a third color resist that are repeatedly arranged in order in a direction along a surface of the base substrate. The inorganic barrier layer comprises a first inorganic barrier layer covering the first color resist, and the first inorganic barrier layer separates the first color resist from the second color resist and the third color resist.

In an embodiment of the present invention, the color filter further comprises the base substrate, the first color resist disposed on the base substrate, the first inorganic barrier layer covering the first color resist and the base substrate, the second color resist disposed on the first inorganic barrier layer, and the third color resist disposed on the first inorganic barrier layer.

In an embodiment of the present invention, the inorganic barrier layer further comprises a second inorganic barrier layer covering the second color resist, and the second inorganic barrier layer separates the second color resist from the third color resist.

In an embodiment of the present invention, the color filter further comprises the base substrate, the first color resist disposed on the base substrate, the first inorganic barrier layer covering the first color resist and the base substrate, the second color resist disposed on the first inorganic barrier layer, the second inorganic barrier layer covering the first inorganic barrier layer and the second color resist, and the third color resist disposed on the second inorganic barrier layer.

In an embodiment of the present invention, material of the color resist layer comprises a mixed color resist material comprising a pigment and a dye, and material of the inorganic barrier layer comprises silicon nitride; the first color resist is one of a red color resist, a green color resist, and a blue color resist; the second color resist is one of the red color resist, the green color resist, and the blue color resist, which is different from the first color resist; and the third color resist is one of the red color resist, the green color resist, and the blue color resist, which is different from the first color resist and the second color resist.

Beneficial effects of the present application are that: a method of manufacturing a color filter includes steps of manufacturing a color resist layer and an inorganic barrier layer on a base substrate. The step of manufacturing the color resist layer includes sequentially forming a first color resist, a second color resist, and a third color resist, and the first color resist, the second color resist, and the third color resist are repeatedly arranged in order in a direction along a surface of the base substrate. The step of manufacturing the inorganic barrier layer includes forming a first inorganic barrier layer covering the first color resist after the first color resist is formed and before the second color resist is formed. By setting an inorganic barrier layer between adjacent color resists, it is possible to avoid diffusion pollution between different color resists and ensure a display performance. An embodiment of the present invention also provides a color filter, which can avoid d diffusion pollution between color resists of different colors and ensure a display performance.

BRIEF DESCRIPTION OF THE SEVERAL VIEWS OF THE DRAWINGS

In order to further understand the features and technical contents of the present invention, please refer to the following detailed description of the present invention and the accompanying drawings, but the drawings are provided for reference and explanation only and are not intended to limit the present invention.

In the drawings:

FIG. 1 is a flowchart of a method of manufacturing a color filter according to a first embodiment the present invention.

FIGS. 2, 3, 4 and 5 are schematic diagrams of specific steps of a method of manufacturing a color filter according to a first embodiment the present invention.

FIG. 6 is a flowchart of a method of manufacturing a color filter according to a second embodiment the present invention.

DETAILED DESCRIPTION OF SPECIFIC EMBODIMENTS OF THE INVENTION

Figure 7:
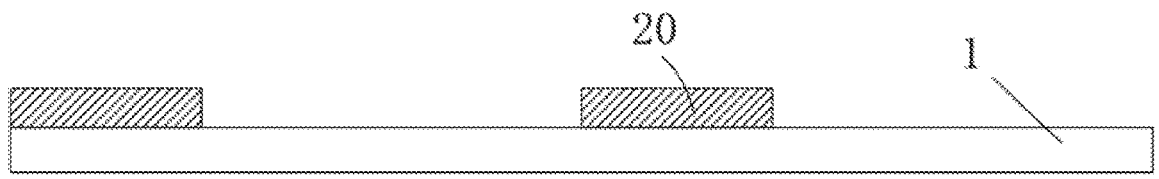
FIGS. 7, 8, 9, 10 and 11 are schematic diagrams of specific steps of a method of manufacturing a color filter according to a second embodiment the present invention.

In order to further explain the technical means and its effects adopted by the present invention, the following describes in detail with reference to the preferred embodiments of the present invention and the accompanying drawings.

Referring to FIG. 1 to FIG. 5, a first embodiment of the present invention provides a method of manufacturing a color filter, including steps of manufacturing a color resist layer 2 and an inorganic barrier layer 3 disposed on a substrate 1.

The step of manufacturing the color resist layer 2 comprises a step of sequentially forming a first color resist 20, a second color resist 30, and a third color resist 40, and the first color resist 20, the second color resist 30, and the third color resist 40 are repeatedly arranged in order in a direction along a surface of the base substrate 1.

The step of manufacturing the inorganic barrier layer 3 comprises a step of forming a first inorganic barrier layer 50 covering the first color resist 20 after the first color resist 20 is formed and before the second color resist 30 is formed.

In an embodiment of the present invention, material of the color resist layer 2 comprises a mixed color resist material comprising a pigment and a dye. The first color resist 20, the second color resist 30, and the third color resist 40 have different colors. Due to small molecule characteristics of the dye in the mixed color resist material, the first color resist 20, the second color resist 30, and the third color resist 40 may have migration issues during the manufacturing process. That is, mutual diffusion pollution occurs between color resists of different colors.

It should be noted that the material of the inorganic barrier layer 3 is preferably silicon nitride (SiNx), so that the inorganic barrier layer has high density, good insulation, and excellent light transmittance. While effectively separating adjacent color resists to prevent migration, it can effectively reduce performance on light transmittance.

Specifically, in a first embodiment of the present invention, there is one kind of color resist showing migration. In a manufacturing method of the color filter of an embodiment of the present invention, the color resist that has issues of migration property is preferentially manufactured. Corresponding to the first embodiment of the present invention, that is, the color resist where migration issue occurs is the first color resist 20. When the red color resist has an issue of migration, the first color resist 20 is the red color resist. The second color resist 30 and the third color resist 40 are a green color resist and a blue color resist, respectively, or a blue color resist and a green color resist, respectively. When the green color resist has migration issues, the first color resist 20 is the green color resist, the second color resist 30 and the third color resist 40 are the red color resist and the blue color resist, or the blue color resist and red color resist. When the blue color resist has migration issues, the first color resist 20 is the blue color resist, the second color resist 30 and the third color resist 40 are the green color resist and the blue color resist, or the blue color resist and green color resist.

Further, in the first embodiment of the present invention, the method of manufacturing the color filter specifically includes the following steps:

Referring to FIG. 2, providing the base substrate 1 on which the first color resist 20 is formed by a first patterning process is provided.

Referring to FIG. 3, forming the first inorganic barrier layer 50 covering the first color resist 20 and the base substrate 1 is provided.

Referring to FIG. 4, forming the second color resist 30 on the first inorganic barrier layer 50 by a second patterning process is provided.

Referring to FIG. 5, forming the third color resist 40 on the first inorganic barrier layer 50 by a third patterning process is provided.

Specifically, the first inorganic barrier layer 50 is formed by chemical vapor deposition (CVD).

Specifically, each patterning process includes a color resist material coated with a corresponding color. A photomask is used to expose the color resist material, and the exposed color resist material is developed to form a pattern. Finally, the color resist material is baked to obtain the first color resist 20, the second color resist 30, or the third color resist 40.

Specifically, referring to FIG. 6 to FIG. 11, a second embodiment of the present invention provides a method of manufacturing a color filter, which includes steps of manufacturing a color resist layer 2 and an inorganic barrier layer 3 on a substrate 1.

The step of manufacturing the color resist layer 2 comprises a step of sequentially forming a first color resist 20, a second color resist 30, and a third color resist 40, and the first color resist 20, the second color resist 30, and the third color resist 40 are repeatedly arranged in order in a direction along a surface of the base substrate 1.

The step of manufacturing the inorganic barrier layer 3 comprises a step of forming a first inorganic barrier layer 50 covering the first color resist 20 after the first color resist 20 is formed and before the second color resist 30 is formed and a step of forming a second inorganic barrier layer 60 covering the second color resist 30 after the second color resist 30 is formed and before the third color resist 40 is formed.

In an embodiment of the present invention, material of the color resist layer 2 comprises a mixed color resist material comprising a pigment and a dye. The first color resist 20, the second color resist 30, and the third color resist 40 have different colors. Due to small molecule characteristics of the dye in the mixed color resist material, the first color resist 20, the second color resist 30, and the third color resist 40 may have migration issues during the manufacturing process. That is, mutual diffusion pollution occurs between color resists of different colors.

It should be noted that the material of the inorganic barrier layer 3 is preferably silicon nitride (SiNx), so that the inorganic barrier layer has high density, good insulation, and excellent light transmittance. While effectively separating adjacent color resists to prevent migration, it can effectively reduce performance on light transmittance.

Specifically, in a second embodiment of the present invention, there are two kinds of color resists showing migration. In a manufacturing method of the color filter of an embodiment of the present invention, the color resist that has issues of migration property is preferentially manufactured. Corresponding to the second embodiment of the present invention, that is, the color resists where migration issue occurs are the first color resist 20 and the second color resist 30. When the red color resist and the green color resist have an issue of migration, the first color resist 20 and the second color resist 30 are red color resist and green color resist, respectively, or the green color resist and red color resist, and the third color resist 40 is blue color resist. When the red color resist and the blue color resist have an issue of migration, the first color resist 20 and the second color resist 30 are red color resist and blue color resist, respectively, or the blue color resist and red color resist, and the third color resist 40 is green color resist. When the green color resist and the blue color resist have an issue of migration, the first color resist 20 and the second color resist 30 are green color resist and blue color resist, respectively, or the blue color resist and green color resist, and the third color resist 40 is red color resist.

Further, in the second embodiment of the present invention, the method of manufacturing the color filter specifically includes the following steps:

Referring to FIG. 7, providing the base substrate 1 on which the first color resist 20 is formed by a first patterning process is provided.

Figure 8:
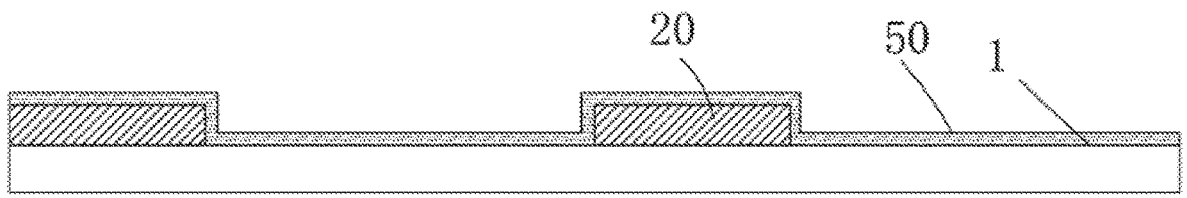

Referring to FIG. 8, forming the first inorganic barrier layer 50 covering the first color resist 20 and the base substrate 1 is provided.

Figure 9:
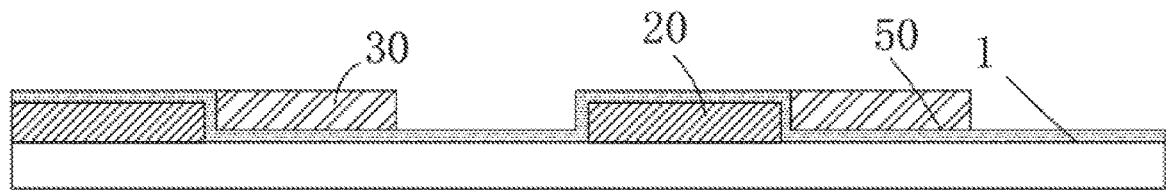

Referring to FIG. 9, forming the second color resist 30 on the first inorganic barrier layer 50 by a second patterning process is provided.

Figure 10:
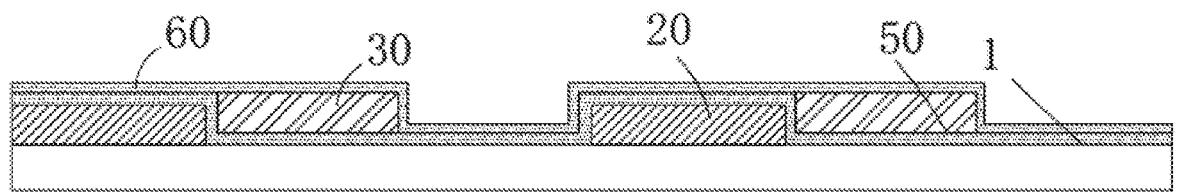

Referring to FIG. 10, forming the second inorganic barrier layer 60 covering the second color resist 30 and the first inorganic barrier layer 50 is provided.

Figure 11:
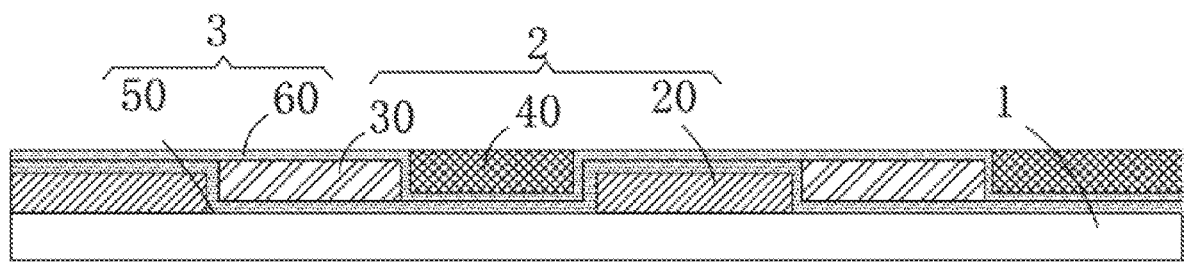

Referring to FIG. 11, forming the third color resist 40 on the first inorganic barrier layer 50 by a third patterning process is provided.

Specifically, the first inorganic barrier layer 50 and the second inorganic barrier layer 60 are formed by chemical vapor deposition (CVD).

Specifically, each patterning process includes a color resist material coated with a corresponding color. A photomask is used to expose the color resist material, and the exposed color resist material is developed to form a pattern. Finally, the color resist material is baked to obtain the first color resist 20, the second color resist 30, or the third color resist 40.

Referring to FIG. 5, corresponding to the first embodiment of the present invention, a color filter according to the present invention includes a base substrate 1, a color resist layer 2, and an inorganic barrier layer 3.

The color resist layer 2 comprises a first color resist 20, a second color resist 30, and a third color resist 40 that are repeatedly arranged in order in a direction along a surface of the base substrate 1.

The inorganic barrier layer 3 comprises a first inorganic barrier layer 50 covering the first color resist 20, and the first inorganic barrier layer 50 separates the first color resist 20 from the second color resist 30 and the third color resist 40.

In an embodiment of the present invention, material of the color resist layer 2 comprises a mixed color resist material comprising a pigment and a dye. The first color resist 20, the second color resist 30, and the third color resist 40 have different colors. Due to small molecule characteristics of the dye in the mixed color resist material, the first color resist 20, the second color resist 30, and the third color resist 40 may have migration issues during the manufacturing process. That is, mutual diffusion pollution occurs between color resists of different colors.

It should be noted that the material of the inorganic barrier layer 3 is preferably silicon nitride (SiNx), so that the inorganic barrier layer has high density, good insulation, and excellent light transmittance. While effectively separating adjacent color resists to prevent migration, it can effectively reduce performance on light transmittance.

Specifically, in an embodiment of the present invention as shown in FIG. 5, the color resist where migration issue occurs is the first color resist 20. When the red color resist has an issue of migration, the first color resist 20 is the red color resist. The second color resist 30 and the third color resist 40 are a green color resist and a blue color resist, respectively, or a blue color resist and a green color resist, respectively. When the green color resist has migration issues, the first color resist 20 is the green color resist, the second color resist 30 and the third color resist 40 are the red color resist and the blue color resist, or the blue color resist and red color resist. When the blue color resist has migration issues, the first color resist 20 is the blue color resist, the second color resist 30 and the third color resist 40 are the green color resist and the blue color resist, or the blue color resist and green color resist.

Specifically, referring to FIG. 5, in a first embodiment of the present invention, the color filter described in this first embodiment includes a base substrate 1, a first color resist 20 disposed on the base substrate 1, a first inorganic barrier layer 50 covering the first color resist 20 and the base substrate 1, a second color resist 30 disposed on the first inorganic barrier layer 50, and a third color resist 40 disposed on the first inorganic barrier layer 50.

Referring to FIG. 11, corresponding to the second embodiment of the present invention, a color filter according to the present invention includes a base substrate 1, a color resist layer 2, and an inorganic barrier layer 3.

The color resist layer 2 comprises a first color resist 20, a second color resist 30, and a third color resist 40 that are repeatedly arranged in order in a direction along a surface of the base substrate 1.

The inorganic barrier layer 3 comprises a first inorganic barrier layer 50 covering the first color resist 20 and a second inorganic barrier layer 60 covering the second color resist 30. The first inorganic barrier layer 50 separates the first color resist 20 from the second color resist 30 and the third color resist 40. The second inorganic barrier layer 60 separates the second color resist 30 and the third color resist 40.

In an embodiment of the present invention, material of the color resist layer 2 comprises a mixed color resist material comprising a pigment and a dye. The first color resist 20, the second color resist 30, and the third color resist 40 have different colors. Due to small molecule characteristics of the dye in the mixed color resist material, the first color resist 20, the second color resist 30, and the third color resist 40 may have migration issues during the manufacturing process. That is, mutual diffusion pollution occurs between color resists of different colors.

It should be noted that the material of the inorganic barrier layer 3 is preferably silicon nitride (SiNx), so that the inorganic barrier layer has high density, good insulation, and excellent light transmittance. While effectively separating adjacent color resists to prevent migration, it can effectively reduce performance on light transmittance.

Specifically, in a second embodiment of the present invention as shown in FIG. 11, the color resists where migration issue occurs are the first color resist 20 and the second color resist 30. When the red color resist and the green color resist have an issue of migration, the first color resist 20 and the second color resist 30 are red color resist and green color resist, respectively, or the green color resist and red color resist, and the third color resist 40 is blue color resist. When the red color resist and the blue color resist have an issue of migration, the first color resist 20 and the second color resist 30 are red color resist and blue color resist, respectively, or the blue color resist and red color resist, and the third color resist 40 is green color resist. When the green color resist and the blue color resist have an issue of migration, the first color resist 20 and the second color resist 30 are green color resist and blue color resist, respectively, or the blue color resist and green color resist, and the third color resist 40 is red color resist.

Specifically, referring to FIG. 11, the color filter described in this second embodiment includes a base substrate 1, a first color resist 20 disposed on the base substrate 1, a first inorganic barrier layer 50 covering the first color resist 20 and the base substrate 1, a second color resist 30 disposed on the first inorganic barrier layer 50, a second inorganic barrier layer 60 covering the first inorganic barrier layer 50 and the second color resist 30, and the third color resist 40 disposed on the second inorganic barrier layer 60.

In summary, in an embodiment of the present invention, a method of manufacturing a color filter includes steps of manufacturing a color resist layer and an inorganic barrier layer on a base substrate. The step of manufacturing the color resist layer includes sequentially forming a first color resist, a second color resist, and a third color resist, and the first color resist, the second color resist, and the third color resist are repeatedly arranged in order in a direction along a surface of the base substrate. The step of manufacturing the inorganic barrier layer includes forming a first inorganic barrier layer covering the first color resist after the first color resist is formed and before the second color resist is formed. By setting an inorganic barrier layer between adjacent color resists, it is possible to avoid diffusion pollution between different color resists and ensure a display performance. An embodiment of the present invention also provides a color filter, which can avoid d diffusion pollution between color resists of different colors and ensure a display performance. An embodiment of the present invention also provides another color filter, which can avoid d diffusion pollution between color resists of different colors and ensure a display performance.

As described above, for a person of ordinary skill in the art, various other corresponding changes and modifications can be made according to the technical solutions and technical concepts of the present invention. All these changes and modifications should belong to the protection scope of the claims of the present invention.

What is claimed is:

1. A method of manufacturing a color filter, comprising:
   steps of manufacturing a color resist layer and an inorganic barrier layer on a base substrate;
   wherein the step of manufacturing the color resist layer comprises a step of sequentially forming a first color resist, a second color resist, and a third color resist, and the first color resist, the second color resist, and the third color resist are repeatedly arranged in order in a direction along a surface of the base substrate; and wherein the step of manufacturing the inorganic barrier layer comprises a step of forming a first inorganic barrier layer covering the first color resist after the first color resist is formed and before the second color resist is formed.

2. The method of manufacturing the color filter according to claim 1, comprising following steps:
providing the base substrate on which the first color resist is formed by a first patterning process;
forming the first inorganic barrier layer covering the first color resist and the base substrate;
forming the second color resist on the first inorganic barrier layer by a second patterning process; and
forming the third color resist on the first inorganic barrier layer by a third patterning process.

3. The method of manufacturing the color filter according to claim 1, wherein the step of manufacturing the inorganic barrier layer further comprises: a step of forming a second inorganic barrier layer covering the second color resist after the second color resist is formed and before the third color resist is formed.

4. The method of manufacturing the color filter according to claim 3, comprising following steps:
providing the base substrate on which the first color resist is formed by a first patterning process;
forming the first inorganic barrier layer covering the first color resist and the base substrate;
forming the second color resist on the first inorganic barrier layer by a second patterning process;
forming the second inorganic barrier layer covering the second color resist and the first inorganic barrier layer; and
forming the third color resist on the first inorganic barrier layer by a third patterning process.

5. The method of manufacturing the color filter according to claim 1, wherein material of the color resist layer comprises a mixed color resist material comprising a pigment and a dye, and material of the inorganic barrier layer comprises silicon nitride;
the first color resist is one of a red color resist, a green color resist, and a blue color resist;
the second color resist is one of the red color resist, the green color resist, and the blue color resist, which is different from the first color resist; and
the third color resist is one of the red color resist, the green color resist, and the blue color resist, which is different from the first color resist and the second color resist.

6. A color filter, comprising:
a base substrate, a color resist layer, and an inorganic barrier layer;
wherein the color resist layer comprises a first color resist, a second color resist, and a third color resist that are repeatedly arranged in order in a direction along a surface of the base substrate;
wherein the inorganic barrier layer comprises a first inorganic barrier layer covering the first color resist, and the first inorganic barrier layer separates the first color resist from the second color resist and the third color resist.

7. The color filter according to claim 6, further comprising the base substrate, the first color resist disposed on the base substrate, the first inorganic barrier layer covering the first color resist and the base substrate, the second color resist disposed on the first inorganic barrier layer, and the third color resist disposed on the first inorganic barrier layer.

8. The color filter according to claim 6, wherein the inorganic barrier layer further comprises a second inorganic barrier layer covering the second color resist, and the second inorganic barrier layer separates the second color resist from the third color resist.

9. The color filter according to claim 8, further comprising the base substrate, the first color resist disposed on the base substrate, the first inorganic barrier layer covering the first color resist and the base substrate, the second color resist disposed on the first inorganic barrier layer, the second inorganic barrier layer covering the first inorganic barrier layer and the second color resist, and the third color resist disposed on the second inorganic barrier layer.

10. The color filter according to claim 6, wherein material of the color resist layer comprises a mixed color resist material comprising a pigment and a dye, and material of the inorganic barrier layer comprises silicon nitride;
the first color resist is one of a red color resist, a green color resist, and a blue color resist;
the second color resist is one of the red color resist, the green color resist, and the blue color resist, which is different from the first color resist; and
the third color resist is one of the red color resist, the green color resist, and the blue color resist, which is different from the first color resist and the second color resist.

11. A color filter, comprising:
a base substrate, a color resist layer, and an inorganic barrier layer;
wherein the color resist layer comprises a first color resist, a second color resist, and a third color resist that are repeatedly arranged in order in a direction along a surface of the base substrate;
wherein the inorganic barrier layer comprises a first inorganic barrier layer covering the first color resist, and the first inorganic barrier layer separates the first color resist from the second color resist and the third color resist;
wherein the color filter further comprises the base substrate, the first color resist disposed on the base substrate, the first inorganic barrier layer covering the first color resist and the base substrate, the second color resist disposed on the first inorganic barrier layer, and the third color resist disposed on the first inorganic barrier layer;
wherein material of the color resist layer comprises a mixed color resist material comprising a pigment and a dye, and material of the inorganic barrier layer comprises silicon nitride;
wherein the first color resist is one of a red color resist, a green color resist, and a blue color resist;
wherein the second color resist is one of the red color resist, the green color resist, and the blue color resist, which is different from the first color resist; and
wherein the third color resist is one of the red color resist, the green color resist, and the blue color resist, which is different from the first color resist and the second color resist.

12. The color filter according to claim 11, wherein the inorganic barrier layer further comprises the second inorganic barrier layer covering the second color resist, and the second inorganic barrier layer separates the second color resist from the third color resist.

13. The color filter according to claim 12, further comprising the base substrate, the first color resist disposed on the base substrate, the first inorganic barrier layer covering the first color resist and the base substrate, the second color resist disposed on the first inorganic barrier layer, the second inorganic barrier layer covering the first inorganic barrier layer and the second color resist, and the third color resist disposed on the second inorganic barrier layer.

* * * * *